(12) United States Patent
Kalnitsky et al.

(10) Patent No.: US 6,365,463 B2
(45) Date of Patent: *Apr. 2, 2002

(54) METHOD FOR FORMING A HIGH-PRECISION ANALOG TRANSISTOR WITH A LOW THRESHOLD VOLTAGE ROLL-UP AND A DIGITAL TRANSISTOR WITH A HIGH THRESHOLD VOLTAGE ROLL-UP

(75) Inventors: Alexander Kalnitsky, San Francisco; Albert Bergemont, Palo Alto, both of CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,450

(22) Filed: May 21, 1999

(51) Int. Cl.[7] ............... H01L 21/336; H01L 21/8234
(52) U.S. Cl. ............. 438/275; 438/524; 438/529; 438/532; 438/533; 438/276; 438/289; 438/305; 438/307
(58) Field of Search ............... 438/338, 234, 438/202, 203, 231, 229, 232, 233, 224, 275, 519, 524, 529, 532, 533, 276, 289, 303, 305, 306, 307; 257/402, 403, 404, 258

(56) References Cited

U.S. PATENT DOCUMENTS

| | | | | |
|---|---|---|---|---|
| 5,554,554 A | * | 9/1996 | Bastani et al. | 437/47 |
| 5,648,288 A | * | 7/1997 | Williams et al. | 437/45 |
| 5,726,477 A | * | 3/1998 | Williams et al. | 257/402 |
| 5,885,874 A | * | 3/1999 | Gardener | 438/289 |
| 5,888,861 A | * | 3/1999 | Chien et al. | 438/202 |
| 5,976,925 A | * | 11/1999 | Cheek et al. | 438/231 |
| 5,976,938 A | * | 11/1999 | Gardner et al. | 438/275 |
| 5,982,003 A | * | 11/1999 | Hu et al. | 257/347 |
| 6,001,677 A | * | 12/1999 | Shimizu | 438/275 |
| 6,051,459 A | * | 4/2000 | Gardener et al. | 438/231 |
| 6,114,206 A | * | 9/2000 | Yu | 438/275 |
| 6,133,130 A | * | 10/2000 | Lin | 438/586 |
| 6,137,145 A | * | 10/2000 | Cheek | 257/369 |
| 6,191,460 B1 | * | 2/2001 | Choi | 257/393 |

OTHER PUBLICATIONS

Kalnitsky, A., et al., "Suppression of the VT Roll–Up Effect in Sub–Micron NMOST," 24th European Solid State Device Research Conference, Edinburgh, Scotland, (1994) pp. 377–380.

* cited by examiner

Primary Examiner—Mary Wilczewski
(74) Attorney, Agent, or Firm—Pillsbury Wintrop LLP

(57) ABSTRACT

A process for forming high-precision analog transistors with a low threshold voltage roll-up and digital transistors with a high threshold voltage roll-up is disclosed. The process selectively implants the polysilicon layer that forms the gates of the analog transistors so that the doping concentration of the analog gates is greater than the doping concentration of the digital gates.

20 Claims, 2 Drawing Sheets

METHOD FOR FORMING A HIGH-PRECISION ANALOG TRANSISTOR WITH A LOW THRESHOLD VOLTAGE ROLL-UP AND A DIGITAL TRANSISTOR WITH A HIGH THRESHOLD VOLTAGE ROLL-UP

BACKGROUND OF THE INVENTION

1. Field of the Invention

The present invention relates to a method for forming transistors and, more particularly, to a method for forming a high-precision analog transistor with a low threshold voltage roll-up and a digital transistor with a high threshold voltage roll-up.

2. Description of the Related Art

The threshold voltage of a MOS transistor is the gate voltage that defines the boundary between the conducting and non-conducting states of the transistor. Gate voltages greater than the threshold voltage cause n-channel transistors to conduct (when an appropriate drain-to-source voltage is present), while p-channel transistors become non-conductive.

On the other hand, gate voltages less than the threshold voltage cause n-channel transistors to stop conducting, while p-channel transistors become conductive (when an appropriate source-to-drain voltage is present).

For long-channel transistors (transistors having a channel length greater than 2 um), the threshold voltage of a transistor can be accurately determined. The same models that are used to predict the threshold voltages of long-channel transistors, however, overstate the threshold voltages for short-channel transistors (the long-channel models typically ignore the effect of the source and drain depletion regions).

Specifically, the threshold voltages of short-channel n-channel transistors are less positive than predicted, while the threshold voltages of short-channel p-channel transistors are less negative than predicted. Thus, one of the effects of a short-channel device is a reduced threshold voltage.

The opposite effect, an increase or roll-up in the threshold voltages, occurs with sub-micron short-channel transistors which are fabricated with current-generation CMOS processes. For digital transistors, this roll-up effect causes few, if any, problems since the precise threshold voltage of digital transistors is typically not an issue. In some cases the roll-up can even increase manufacturing yields by raising the threshold voltages of devices that would otherwise have unacceptably low threshold voltages.

This is not the case, however, for high-precision analog transistors. High-precision analog circuits often rely on matched pairs of analog transistors for proper operation. Although two transistors can be formed to have nearly identical dimensions, most matched pairs of analog transistors have slight differences in length which, in turn, lead to slight degradations in the performances of the matched pairs. The threshold voltage roll-up accentuates these differences which further degrades the performances of the matched pairs.

In the paper by Alexander Kalnitsky et al., Suppression of the Vt Roll-Up Effect in Sub-Micron NMOST, 24th European Solid State Device Research Conference, Edinbougrh, 1994, the authors report that the threshold voltage roll-up effect is strongly related to the doping concentration of the polysilicon gates of the transistors.

SUMMARY OF THE INVENTION

The present invention provides a method that reduces the threshold voltage roll-up of a high-precision analog transistor, while also allowing the threshold voltage of a digital transistor to roll up. The method, which forms a device in a semiconductor material of a first conductivity type, begins by forming a layer of gate oxide on the semiconductor material. A layer of polysilicon is then formed on the layer of gate oxide.

Following this, the layer of polysilicon is selectively implanted with a dopant to dope the area where the gate of the analog transistor is to be formed. Next, the layer of polysilicon is etched to form a digital gate, an analog gate, and a plurality of exposed areas on the surface of the semiconductor material.

After the etch, the digital gate, the analog gate, and the exposed surface areas are implanted with a dopant to dope the digital gate, further dope the analog gate, and form source and drain regions adjacent to the digital gate and the analog gate.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 1–4 show a series of cross-sectional views that illustrate a process flow for forming a device which has n-channel analog transistors with a low threshold voltage roll-up and digital transistors with a high threshold voltage roll-up in accordance with the present invention.

Figure 1:
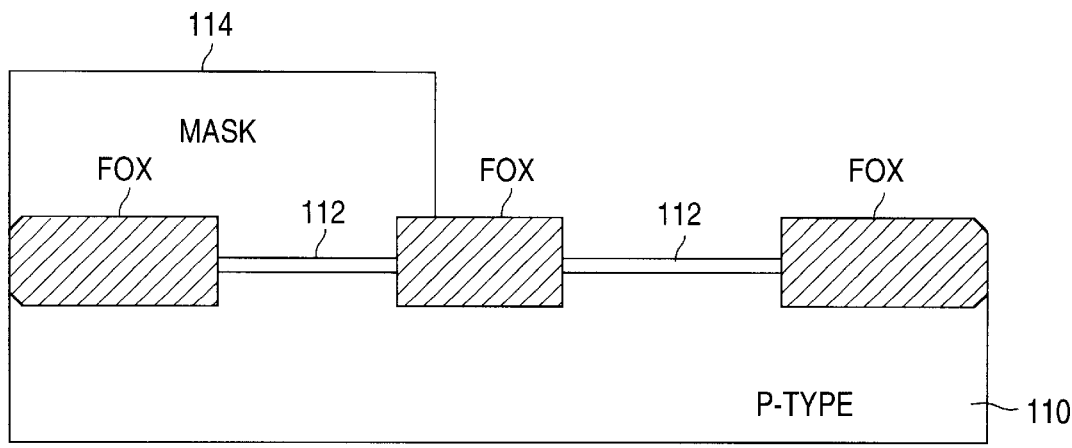
FIGS. 1–4 are a series of cross-sectional views illustrating a process flow for forming a device which has n-channel analog transistors with a low threshold voltage roll-up and digital transistors with a high threshold voltage roll-up in accordance with the present invention.

As shown in FIG. 1, the process of the present invention begins with a conventionally formed wafer which has a p-type semiconductor material 110. Material 110 can be implemented as a well formed in a substrate, or as a substrate.

In addition, the wafer also has a number of spaced-apart field oxide regions FOX which are formed in material 110. The field oxide regions FOX can be implemented with LOCOS, trench, or other well known isolation structures.

From this point, a layer of sacrificial oxide 112 is formed on material 110. After this, an analog threshold adjust mask 114 is formed and patterned on oxide layer 112 to expose the surface of oxide layer 112 where the analog n-channel transistors are to be formed.

Next, the exposed surface of oxide layer 112 is implanted with a dopant to adjust the threshold voltages of the to-be-formed analog n-channel transistors. Once the implant has been completed, mask 114 is removed.

Once mask 114 has been removed, a digital threshold mask (not shown) is formed and patterned on oxide layer 112 to expose the surface of oxide layer 112 where the digital n-channel transistors are to be formed. Next, the exposed surface of oxide layer 112 is implanted with a dopant to adjust the threshold voltages of the to-be-formed digital n-channel transistors.

Following the implant, the digital threshold mask and the layer of sacrificial oxide 112 are removed. Alternately, a single mask can be used to adjust the threshold voltages of both the analog and digital n-channel transistors when equivalent dopant concentrations are acceptable. Once oxide layer 112 has been removed, the surface of material 110 is cleaned.

Figure 2:
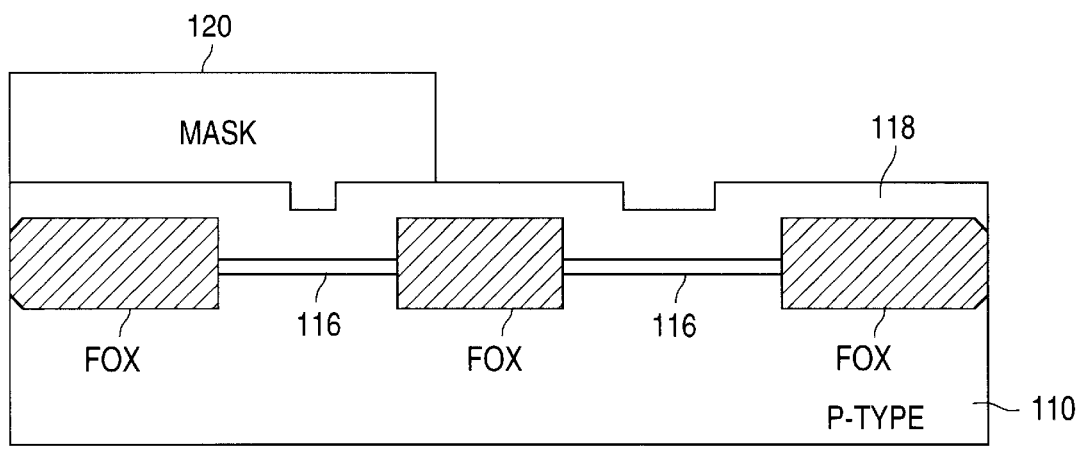

Next, as shown in FIG. 2, a layer of gate oxide 116 is formed on material 110. After this, a layer of polysilicon (poly) 118 is formed on gate oxide layer 116. In accordance with the present invention, a poly doping mask 120 is then formed over poly layer 118 to expose the surface of poly layer 118 where the n-channel analog transistors are to be formed.

Following this, a n-type dopant, such as phosphorous or arsenic, is implanted into poly layer 118. A relatively high dose of up to $4 \times 10^{16}$ atoms/cm$^2$ is utilized. Once poly layer 118 has been doped, mask 120 is removed.

Figure 3:
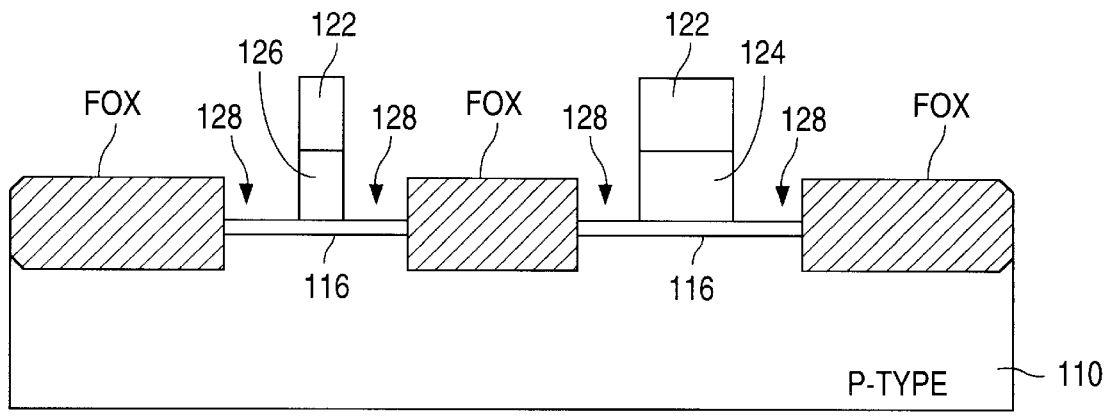

Next, as shown in FIG. 3, a gate definition mask 122 is formed and patterned on poly layer 118. After this, poly layer 118 is etched to form an analog gate 124, a digital gate 126, and exposed areas 128 on the surface of material 110. Once the etch has been completed, gate definition mask 122 is removed.

Figure 4:
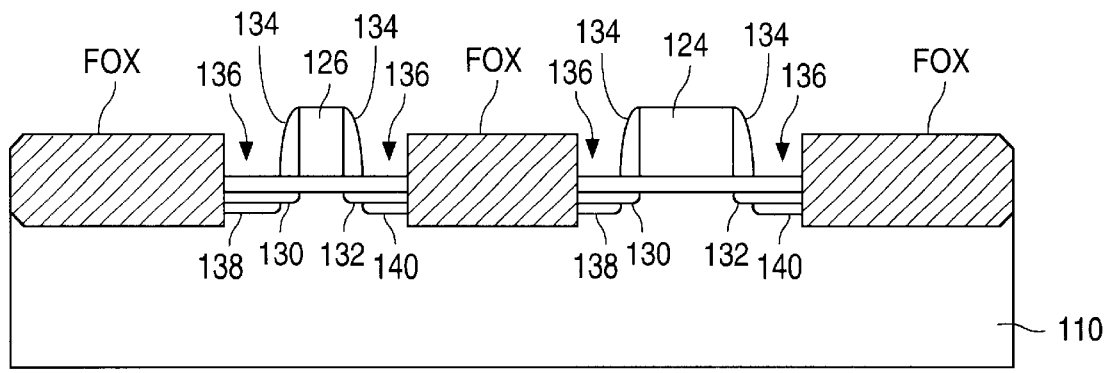

After this, as shown in FIG. 4, gates 124 and 126 and the exposed areas 128 are implanted with an n-type dopant to further dope analog gate 124, dope digital gate 126 for the first time, and form lightly-doped n- source and drain regions 130 and 132.

Next, a layer of isolation material (not shown) is formed over gates 124 and 126 and the exposed areas 128. The layer of isolation material is then anisotropically etched back to form spacers 134 and smaller exposed areas 136 on the surface of semiconductor material 110.

Following this, gates 124 and 126 and the exposed areas 136 are implanted with an n-type dopant to further dope analog gate 124 and digital gate 126, and to form heavily-doped n+source and drain regions 138 and 140. Following this, the process continues with conventional steps.

One of the advantages of the present invention is that by separately implanting the gates of the analog transistors, only the roll-up in the threshold voltage of the analog transistor is suppressed. The digital transistor continues to experience a threshold voltage roll-up.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method of forming a device on a semiconductor wafer, the method comprising the steps of:

forming a dielectric layer on the semiconductor wafer;

forming a layer of material on the dielectric layer, the layer of material having a first region and a second region spaced apart from the first region;

doping the first region of the layer of material with a first dopant to have a first dopant concentration;

etching the layer of material to form a first gate from the first region and a second gate from the second region, and expose a surface region adjacent to the first and second gates;

doping the first gate, the second gate, and the surface region with a second dopant to dope the first gate, dope the second gate, form a first source region and a first drain region in the semiconductor wafer on opposite sides of the first gate, and form a second source region and a second drain region in the semiconductor wafer on opposite sides of the second gate so that the layer of material forming the first gate has a second dopant concentration, the layer of material forming the second gate has a third dopant concentration, the first source and drain regions each have a fourth dopant concentration, and the second source and drain regions each have the fourth dopant concentration, the second dopant concentration being greater than the third dopant concentration by the first dopant concentration.

2. The method of claim 1 wherein the third dopant concentration and the fourth dopant concentration are substantially equal.

3. The method of claim 1 and further comprising the steps of:

forming an isolation layer on the first gate, the second gate, and the surface region;

anisotropically etching the isolation layer to form spacers adjacent to the first and second gates, the spacers covering portions of the first source and drain regions and the second source and drain regions to form partially-exposed first source and drain surface regions and partially-exposed second source and drain surface regions; and doping the first gate, the, second gate, the partially-exposed first source and drain surface regions, and the partially-exposed second source and drain surface regions with a third dopant to dope the first gate, dope the second gate, form a third source region and a third drain region on opposite sides of the first gate in the semiconductor wafer in the first source and first drain regions, respectively, and form a fourth source region and a fourth drain region on opposite sides of the second gate in the semiconductor wafer and in the second source and drain regions, respectively so that the layer of material forming the first gate has a fifth dopant concentration, the layer of material forming the second gate has a sixth dopant concentration, the third source and drain regions each have a seventh dopant concentration, the fourth source and drain regions each have the seventh dopant concentration, the fifth dopant concentration being greater than the sixth dopant concentration by the first dopant concentration.

4. The method of claim 3 wherein the seventh dopant concentration is greater than the fourth dopant concentration.

5. The method of claim 3 wherein the third dopant concentration and the fourth dopant concentration are substantially equal.

6. The method of claim 3 wherein the doping step that forms the first source region includes the steps of:

forming a mask over the semiconductor wafer that exposes the first gate, the second gate, a first source area, a first drain area, a second source area, and a second drain area on the surface region; and implanting the second dopant into the semiconductor wafer to dope the first gate, dope the second gate, form the first source and drain regions, and form the second source and drain regions.

7. The method of claim 6 wherein the doping step that forms the third source region includes the steps of:

forming a mask over the semiconductor wafer that exposes the first gate, the second gate, a third source area, a third drain area, a fourth source area, and a fourth drain area on the surface region; and implanting the third dopant into the semiconductor wafer to dope the first gate, dope the second gate, form the third source and drain regions, and form the fourth source and drain regions.

8. The method of claim 3 wherein the first dopant, the second dopant, and the third dopant are phosphorous.

9. The method of claim 1 wherein the layer of material is polysilicon and the dielectric layer is a layer of gate oxide.

10. The method of claim 9 wherein the third dopant concentration and the fourth dopant concentration are substantially equal.

11. The method of claim 9 and further comprising the steps of:

forming an isolation layer on the first gate, the second gate, and the surface region;

anisotropically etching the isolation layer to form spacers adjacent to the first and second gates, the spacers covering portions of the first source and drain regions and the second source and drain regions to form partially-exposed first source and drain surface regions and partially-exposed second source and drain surface regions; and doping the first gate, the second gate, the partially-exposed first source and drain surface regions, and the partially-exposed second source and drain surface regions with a third dopant to dope the first gate, dope the second gate, form a third source region and a third drain region on opposite sides of the first gate in the semiconductor wafer in the first source and first drain regions, respectively, and form a fourth source region and a fourth drain region on opposite sides of the second gate in the semiconductor wafer in the second source and drain regions, respectively so that the layer of material forming the first gate has a fifth dopant concentration, the layer of material forming the second gate has a sixth dopant concentration, the third source and drain regions each have a seventh dopant concentration, the fourth source and drain regions each have the seventh dopant concentration, the fifth dopant concentration being greater than the sixth dopant concentration by the first dopant concentration.

12. The method of claim 11 wherein the seventh dopant concentration is greater than the fourth dopant concentration.

13. The method of claim 11 wherein the third dopant concentration and the fourth dopant concentration are substantially equal.

14. The method of claim 1 wherein the first dopant and the second dopant are phosphorous.

15. A method of forming a device on a semiconductor wafer, the method comprising the steps of:

forming a dielectric layer on the semiconductor wafer;

forming a layer of material on the dielectric layer, the layer of material having a first region and a second region spaced apart from the first region;

doping the first region of the layer of material with a first dopant at a first dose;

etching the layer of material to form a first gate from the first region and a second gate from the second region, and expose a surface region adjacent to the first and second gates;

doping the first gate, the second gate, and the surface region with a second dopant at a second dose to dope the first gate, dope the second gate, form a first source region and a first drain region in the semiconductor wafer on opposite sides of the first gate, and form a second source region and a second drain region in the semiconductor wafer on opposite sides of the second gate so that the layer of material forming the first gate receives both the first and the second dose, the layer of material forming the second gate receives only the second dose, and the first source and drain regions and the second source and drain regions each receive only the second dose.

16. The method of claim 15 wherein the layer of material is polysilicon and the dielectric layer is a layer of gate oxide.

17. The method of claim 15 wherein the first dopant and the second dopant are phosphorous.

18. A method of forming a device on a semiconductor wafer, the method comprising the steps of:

forming a dielectric layer on the semiconductor wafer;

forming a layer of material on the dielectric layer, the layer of material having a first region and a second region spaced apart from the first region;

doping the first region of the layer of material with a first dopant at a first dose;

etching the layer of material to form a first gate from the first region and a second gate from the second region, and expose a surface region adjacent to the first and second gates;

doping the first gate, the second gate, and the surface region with a second dopant at a second dose to dope the first gate, dope the second gate, form a first source region and a first drain region in the semiconductor wafer on opposite sides of the first gate, and form a second source region and a second drain region in the semiconductor wafer on opposite sides of the second gate;

forming an isolation layer on the first gate, the second gate, and the surface region;

anisotropically etching the isolation layer to form spacers adjacent to the first and second gates, the spacers covering portions of the first source and drain regions and the second source and drain regions to form partially-exposed first source and drain surface regions and partially-exposed second source and drain surface regions; and doping the first gate, the second gate, the partially-exposed first source and drain surface regions, and the partially-exposed second source and drain surface regions with a third dopant at a third dose to dope the first gate, dope the second gate, form a third source region and a third drain region on opposite sides of the first gate in the first source and first drain regions, respectively, and form a fourth source region and a fourth drain region on opposite sides of the second gate in the second source and drain regions, respectively, so that the layer of material forming the first gate receives the first dose, the second dose, and the third dose, the layer of material forming the second gate receives only the second dose and the third dose, and the first source and drain regions and the second source and drain regions each receive only the second dose and the third dose.

19. The method of claim 18 wherein the layer of material is polysilicon and the dielectric layer is a layer of gate oxide.

20. The method of claim 18 wherein the first dopant, the second dopant, and the third dopant are phosphorous.

* * * * *

UNITED STATES PATENT AND TRADEMARK OFFICE
CERTIFICATE OF CORRECTION

PATENT NO. : 6,365,463 B2
DATED : April 2, 2002
INVENTOR(S) : Alexander Kalnitsky et al.

It is certified that error appears in the above-identified patent and that said Letters Patent is hereby corrected as shown below:

<u>Title page,</u>
Item [74], *Attorney, Agent or Firm*, please delete "Pillsbury Wintrop LLP" and replace with -- Pillsbury Winthrop LLP --.

<u>Column 4,</u>
Line 24, delete "the," and replace with -- the --.

Signed and Sealed this

Fourth Day of June, 2002

*Attest:*

*Attesting Officer*

JAMES E. ROGAN
*Director of the United States Patent and Trademark Office*